(12) United States Patent
Hosoda et al.

(10) Patent No.: US 8,076,966 B2
(45) Date of Patent: Dec. 13, 2011

(54) ANALOG SWITCH CIRCUIT FOR WIDE FREQUENCY BAND

(75) Inventors: Minoru Hosoda, Yokohama (JP); Mitsuo Kitamura, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 11 days.

(21) Appl. No.: 12/710,543

(22) Filed: Feb. 23, 2010

(65) Prior Publication Data

US 2010/0214004 A1    Aug. 26, 2010

(30) Foreign Application Priority Data

Feb. 24, 2009    (JP) ................... 2009-041029

(51) Int. Cl.
 *H03K 17/16*    (2006.01)
(52) U.S. Cl. ....................... 327/390; 327/589
(58) Field of Classification Search ............... 327/390, 327/536, 589
 See application file for complete search history.

(56) References Cited

U.S. PATENT DOCUMENTS

| 6,323,697 | B1  |  11/2001 | Pavan |
| 6,559,689 | B1* |  5/2003  | Clark ............................. 327/97 |
| 6,756,623 | B2* |  6/2004  | Furuie et al. .................. 257/296 |
| 7,113,116 | B2* |  9/2006  | Brewer et al. ................ 341/122 |

FOREIGN PATENT DOCUMENTS

| JP | 2002-43908  | 2/2002 |
| JP | 2002-233134 | 8/2002 |
| JP | 2004-245743 | 9/2004 |
| JP | 2008-35153  | 2/2008 |

OTHER PUBLICATIONS

Abo, Andrew M. et al.,"A 1.5-V, 10-bit, 14.3-MS/s CMOS Pipeline Analog-to-Digital Converter",*IEEE Journal of Solid-State Circuits*, vol. 34, No. 5, May 1999, 599-606.

* cited by examiner

*Primary Examiner* — Kenneth B. Wells
(74) *Attorney, Agent, or Firm* — Fujitsu Patent Center

(57) ABSTRACT

An analog switch circuit that includes a first field-effect transistor, a source of which is coupled to a first switch terminal, and a drain of which is coupled to a second switch terminal; a first capacitance storing electric charge; a second capacitance storing electric charge; a first switch circuit that couples the first capacitance between a direct current voltage node and a reference potential node; a second switch circuit that couples the first capacitance and the second capacitance in parallel; and a third switch circuit that couples the second capacitance between a gate and the source of the first field-effect transistor.

7 Claims, 19 Drawing Sheets

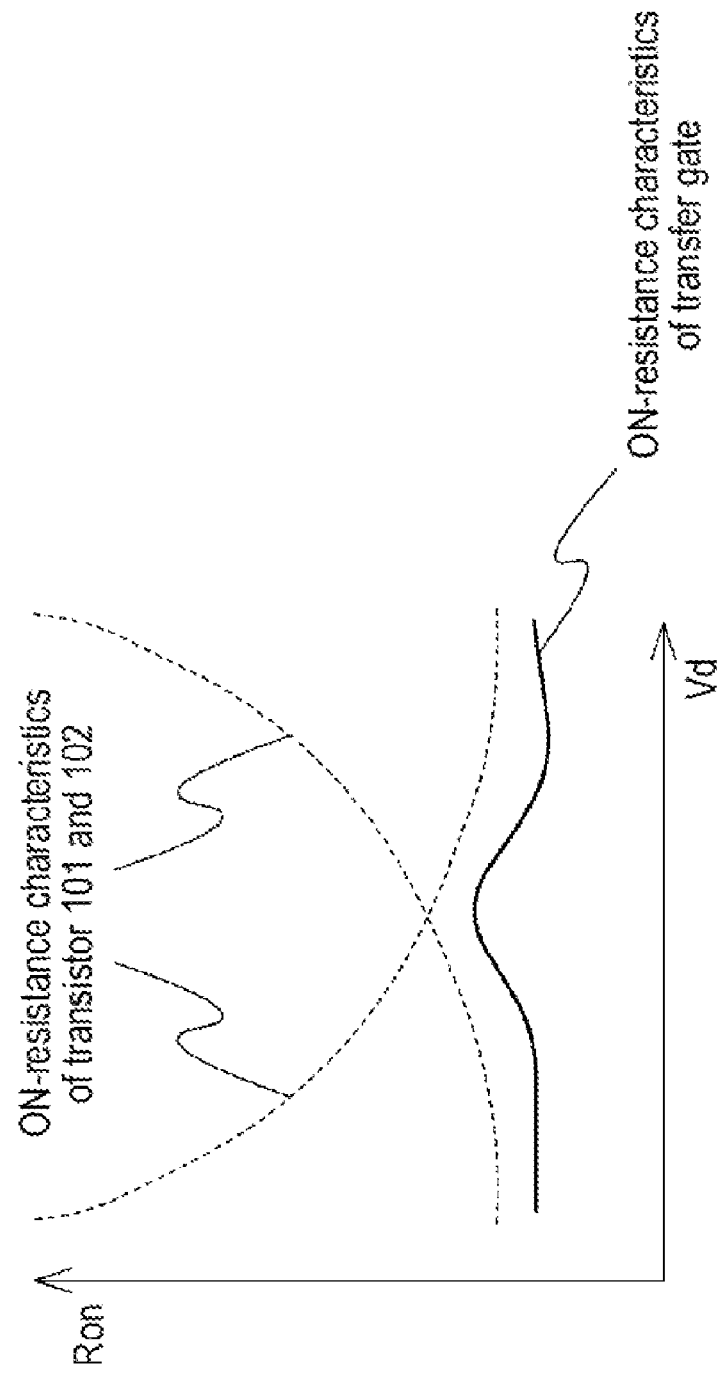

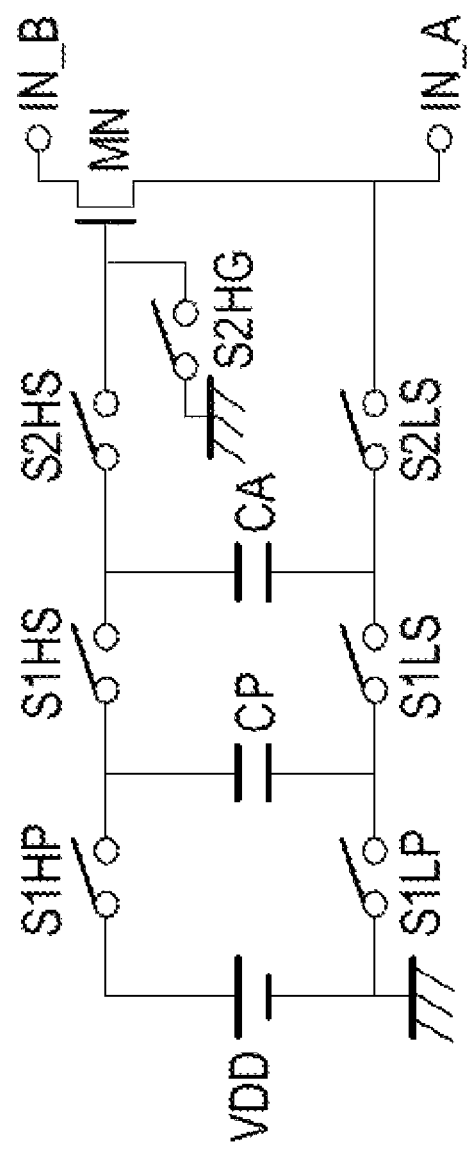

ANALOG SWITCH CIRCUIT FOR WIDE FREQUENCY BAND

CROSS-REFERENCE TO RELATED APPLICATIONS

This application is based upon and claims the benefit of priority of the prior Japanese Patent Application No. 2009-41029, filed on Feb. 24, 2009, the entire contents of which are incorporated herein by reference.

FIELD

The present disclosure relates to an analog switch circuit.

BACKGROUND

An analog switch circuit is used for switching an analog signal. Regarding characteristics of an analog switch circuit that is used in a signal path of an analog signal, it is noted that ON-resistance of a switch can distort a signal waveform.

Japanese Laid-open Patent Publication No. 2008-35153 describes a conventional circuit that maintains a constant ON-resistance. However, the circuit is not effective for low frequency signals. There is also a drawback of the conventional circuit in that ON-resistance may not be sufficiently reduced because only up to ½ VDD is applied between a gate and a source or drain in the conventional circuit.

IEEE JOURNAL OF SOLID-STATE CIRCUITS, VOL. 34 No. 5, MAY 1999 "A 1.5-V, 10-bit, 14.3-MS/s CMOS Pipeline Analog to Digital Converter" discusses a conventional bootstrap circuit that maintains ON-resistance of a sampling switch constant. However, this conventional circuit may not operate continuously because it repeats ON and OFF operations. Accordingly, the conventional bootstrap circuit is not suitable for using as an analog switch. In other words, the conventional bootstrap circuit configuration does not support continuous signals with low frequency, and is not for practical as an analog switch.

SUMMARY

According to an aspect of an embodiment, an analog switch circuit includes: a first field-effect transistor, a source of which is coupled to a first switch terminal, and a drain of which is coupled to a second switch terminal; a first capacitance to store electric charge; a second capacitance to store electric charge; a first switch circuit that couples the first capacitance between a direct current voltage node and a reference potential node; a second switch terminal that couples the first capacitance and the second capacitance in parallel; and a third switch circuit that couples the second capacitance between a gate and the source of the first field-effect transistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a graph illustrating ON-resistance characteristics of the transfer gate illustrated in FIG. 1;

FIG. 3 illustrates an example of an analog switch circuit according to a first embodiment;

DESCRIPTION OF EMBODIMENTS

Figure 1:
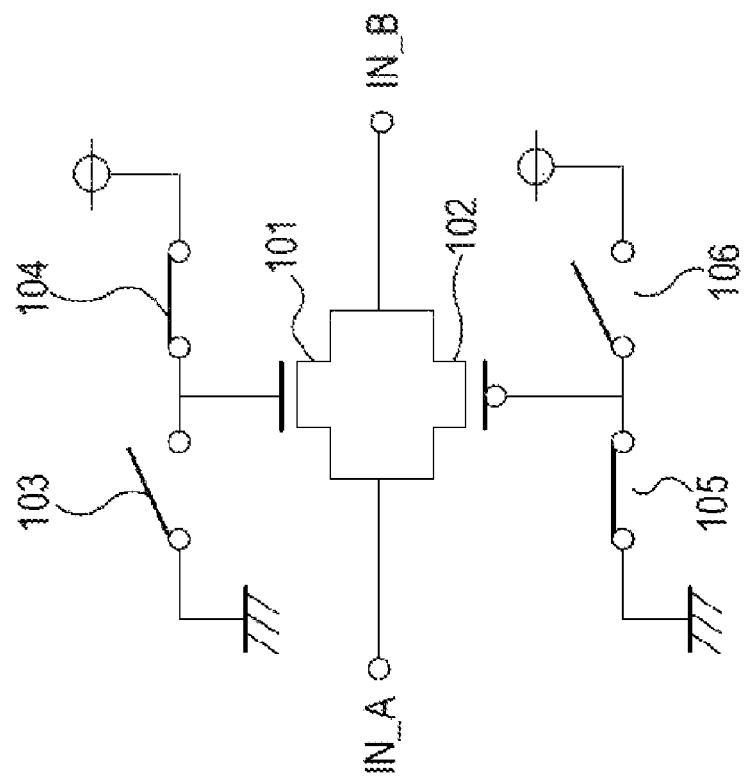
FIG. 1 is a circuit diagram illustrating an example of an analog switch circuit of a transfer gate.

FIG. 1 is a circuit diagram illustrating an example of an analog switch circuit of a transfer gate. A source of an n-channel field-effect transistor 101 is coupled to a first switch terminal IN_A and a drain of the n-channel field-effect transistor 101 is coupled to a second switch terminal IN_B. A switching element 103 is coupled between a gate of the n-channel field-effect transistor 101 and a reference potential node. A switching element 104 is coupled between the gate of the n-channel field-effect transistor 101 and a direct current (DC) voltage node. A source of a p-channel field-effect transistor 102 is coupled to the first switch terminal IN_A, and a drain of the p-channel field-effect transistor 102 is coupled to the second switch terminal IN_B. A switching element 105 is coupled between a gate of the p-channel field-effect transistor 102 and a reference potential node. A switching element 106 is coupled between the gate of the p-channel field-effect transistor 102 and a DC voltage node.

The transistors 101 and 102 are turned on when the switching elements 104 and 105 are turned on while the switching elements 103 and 106 are turned off. Accordingly, in this state, analog signals pass through between the first switch terminal IN_A and the second switch terminal IN_B.

The transistors 101 and 102 are turned off when the switching elements 104 and 105 are turned off while the switching elements 103 and 106 are turned on. Accordingly, in this state, analog signals may not pass through between the first switch terminal IN_A and the second switch terminal IN_B.

FIG. 2 is a graph illustrating ON-resistance characteristics of the transfer gate illustrated in FIG. 1. The horizontal axis indicates voltage Vd of an analog signal that passes through, while the vertical axis indicates ON-resistance of a transfer gate Ron. The two dotted lines indicate ON-resistance characteristics of the transistor 101 and the transistor 102. The solid line indicates ON-resistance characteristics of the transfer gate and represents combined characteristics of the two dotted lines. As shown in FIG. 2, On-characteristics of the transfer gate are not constant relative to a voltage Vd of an analog signal. For example, there is a rise around an intermediate voltage, and this may cause distortion of an analog signal waveform when a voltage Vd of an analog signal is continuously changed.

Hereafter, embodiments will be described that enable a reduction of distortion generated in a waveform of an input signal due to variations of the ON-resistance Ron even when input signal voltage Vd is changed.

First Embodiment

FIG. 3 illustrates an example of an analog switch circuit according to a first embodiment. A first field-effect transistor MN is an n-channel field-effect transistor, a source of which is coupled to a first switch terminal IN_A and a drain of which is coupled to a second switch terminal IN_B. A first capacitance CP and a second capacitance CA are for storing electric charge. A first switching element S1HP is coupled between a DC voltage node of a DC power supply VDD and a first terminal of the first capacitance CP. A second switching element S1LP is coupled between a reference potential node of the DC power supply VDD (for example, a ground potential node) and a second terminal of the first capacitance CP. A third switching element S1HS is coupled between the first terminal of the first capacitance CP and a first terminal of the second capacitance CA. A fourth switching element S1LS is coupled between the second terminal of the first capacitance CP and the second terminal of the second capacitance CA. A fifth switching element S2HS is coupled between the first terminal of the second capacitance CA and a gate of the first field-effect transistor MN. A sixth switching element S2LS is coupled between the second terminal of the second capacitance CA and a source of the first field-effect transistor MN. A seventh switching element S2HG is coupled between the gate of the first field-effect transistor MN and a reference potential node.

The first switching element S1HP and the second switching element S1LP compose a first switch circuit. The first switch circuit is for coupling the first capacitance CP between the DC voltage node of the DC power supply VDD and the reference potential node.

The third switching element S1HS and the fourth switching element S1LS compose a second switch circuit. The second switch circuit is for coupling the first capacitance CP and the second capacitance CA in parallel.

The fifth switching element S2HS and the sixth switching element S2LS compose a third switch circuit. The third switch circuit is for coupling the second capacitance CA between the gate and the source of the first field-effect transistor MN.

Figure 4A:
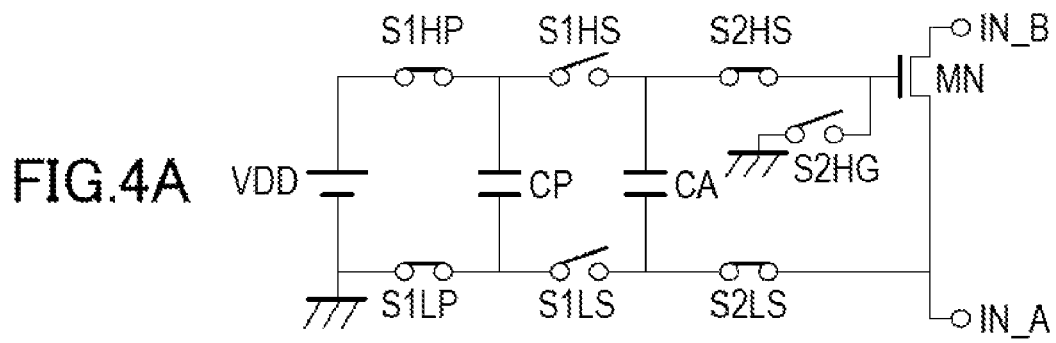
FIG. 4A illustrates an operation of the analog switch circuit illustrated in FIG. 3.
Figure 4B:
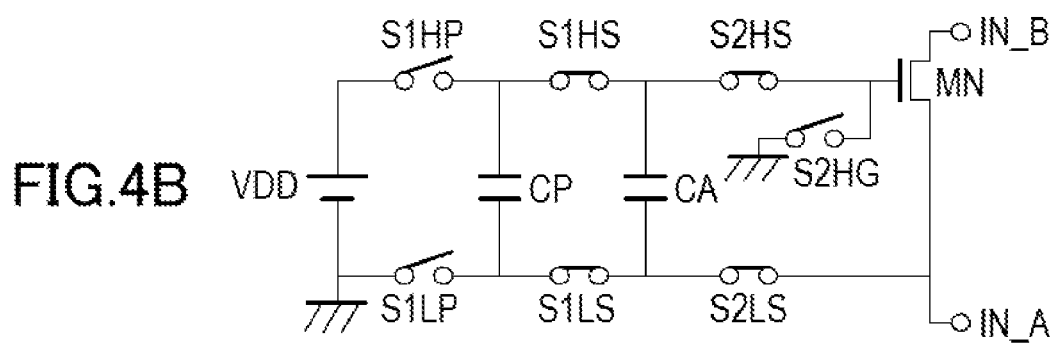
FIG. 4B illustrates an operation of the analog switch circuit illustrated in FIG. 3.
Figure 4C:
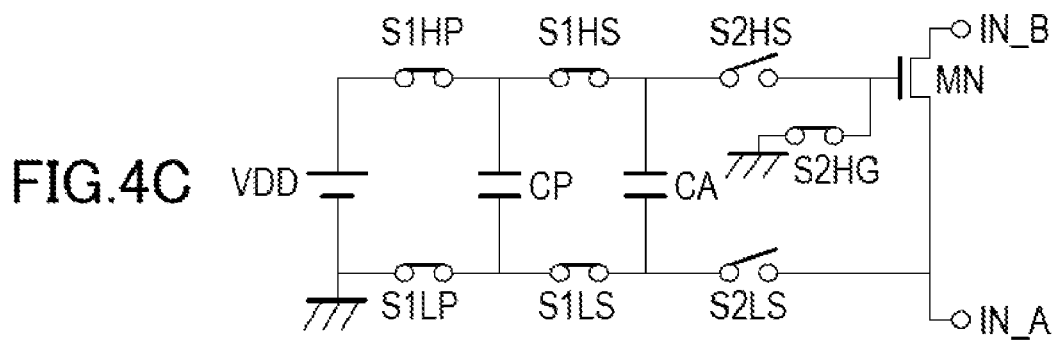
FIG. 4C illustrates an operation of the analog switch circuit illustrated in FIG. 3

FIGS. 4A to 4C illustrate operations of the analog switch circuit illustrated in FIG. 3. An operation of the analog switch circuit under an on-state will be described by referring to FIGS. 4A and 4B.

In FIG. 4A, switching elements S1HP, S1LP, S2HS, and S2LS are turned on and switching elements S1HS, S1LS, and S2HG are turned off. Accordingly, in this state, a DC voltage of the DC power supply VDD is charged to the first capacitance CP.

In FIG. 4B, switching elements S1HP, S1LP, and S2HG are turned off while switching elements S1HS, S1LS, S2HS, and S2LS are turned on. Accordingly, the second capacitance CA charges in response to a voltage from the first capacitance CP. A DC voltage of the first capacitance CP and the second capacitance CA are supplied between the gate and the source of the first field-effect transistor MN. The state of switching elements illustrated in FIG. 4A and the state of the switching elements illustrated in FIG. 4B are alternately repeated.

As a result, the first field-effect transistor MN turns on and an analog signal pass through between the first switch terminal IN_A and the second switch terminal IN_B. A voltage between the gate and the source of the first field-effect transistor MN is maintained at a substantially constant value, and the ON-resistance is maintained at a substantially constant value as well. The ON-resistance of the first field-effect transistor MN is substantially constant value regardless of a voltage of an analog signal that passes through between the first switch terminal IN_A and the second switch terminal IN_B, thus a distortion of a waveform of an analog signal that passes through may be reduced and/or prevented. The analog switch circuit operates effectively even when the analog signal input to the switch terminal IN_A has a low frequency. Thus, first field-effect MN allows passing an analog signal over a wide bandwidth.

As described above, a pair of the switching elements S1HP and S1LP operates substantially simultaneously, and a pair of the switching elements S1HS and S1LS operates substantially simultaneously. The two pairs are not turned on simultaneously in an on-state.

As illustrated in FIG. 4A, the switching elements S1HP and S1LP are turned on and the switching elements S1HS and S1LS are turned off to charge the first capacitance CP. As illustrated in FIG. 4B, the switching elements S1HP and S1LP are turned off and the switching elements S1HS and S1LS are turned on to store electric charge of the first capacitance CP to the second capacitance CA. A gate potential of the first field-effect transistor MN becomes a potential obtained by adding the potential of the first switch terminal IN_A and the potential charged to the second capacitance CA. A source potential of the first field-effect transistor MN becomes substantially the same as that of the first switch terminal IN_A. Therefore, a voltage between the gate and the source of the first filed-effect transistor MN becomes substantially constant by the voltage charged to the second capacitance CA. A bias voltage of the first field-effect transistor MN becomes substantially constant, thus, the ON-resistance of the first field-effect transistor MN becomes substantially constant. Low distortion characteristics of analog signals that pass through the first field-effect transistor MN may be achieved by maintaining the ON-resistance of the first field-effect transistor MN substantially constant.

An operation of the analog switch circuit under an off-state will be described by referring to FIG. 4C. Switching elements S1HP, S1LP, S1HS, S1LS, and S2HG are turned on, and switching elements S2HS and S2LS are turned off. The gate potential of the first field-effect transistor MN becomes substantially the same as the potential of the reference potential node, while the source potential of the first field-effect transistor MN becomes substantially the same as the potential of the first switch terminal IN_A. Accordingly, the first field-effect transistor MN is turned off and an analog signal between the first switch terminal IN_A and the second switch terminal IN_B is blocked.

Second Embodiment

Figure 5:
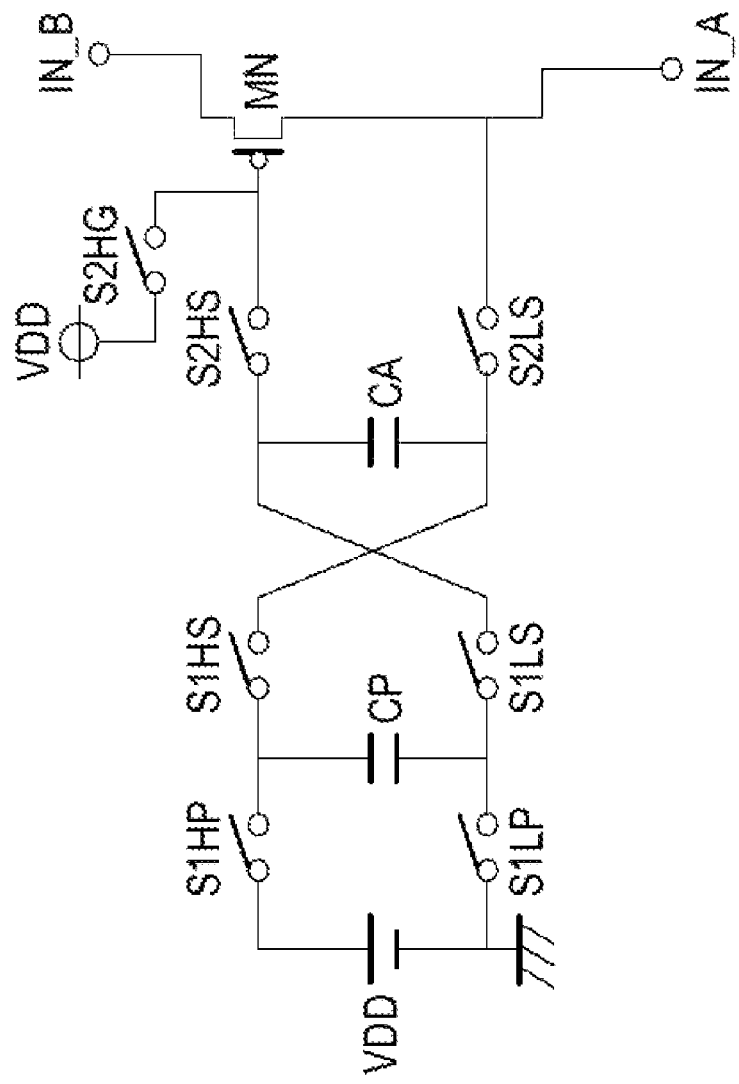
FIG. 5 illustrates an example of an analog switch circuit according to a second embodiment.

FIG. 5 is a circuit diagram illustrating an example of an analog switch circuit according to a second embodiment. In the second embodiment, a case in which a first field-effect transistor MN is a p-channel field-effect transistor will be described. Hereunder, points that are different from those of the first embodiment will be described.

A source of the p-channel field-effect transistor MN is coupled to a first switch terminal IN_A and a drain of the p-channel field-effect transistor MN is coupled to a second switch terminal IN_B. A third switching element S1HS is coupled between a first terminal of a first capacitance CP and a second terminal of a second capacitance CA. A fourth switching element S1LS is coupled between the second terminal of the first capacitance CP and the first terminal of the second capacitance CA. A fifth switching element S2HS is coupled between the first terminal of the second capacitance CA and a gate of the p-channel field-effect transistor MN. A sixth switching element S2LS is coupled between the second terminal of the second capacitance CA and the source of the p-channel field-effect transistor MN. A seventh switching element S2HG is coupled between the gate of the p-channel transistor MN and a DC voltage node of a DC power supply VDD.

An operation of the analog switch circuit according to the second embodiment is substantially the same as that of the first embodiment. When the analog switch circuit is in an on-state, the second capacitance CA supplies a potential that is lower than a potential of the source for the amount of a DC voltage of the DC power supply VDD to the gate of the p-channel field-effect transistor MN. As a result, the p-channel field-effect transistor MN is turned on. A bias voltage of the p-channel field-effect transistor MN becomes substantially constant, thus ON-resistance of the p-channel field-effect transistor MN becomes substantially constant. Low distortion characteristics of analog signals that pass through the p-channel field-effect transistor MN may be achieved by making ON-resistance of the p-channel field-effect transistor MN substantially constant. The second embodiment may achieve substantially the same effects as those of the first embodiment.

The seventh switching element S2HG is turned on when the analog switch circuit is in an off-state. The gate potential of the p-channel field-effect transistor MN becomes substantially the same as a DC voltage of the DC power supply VDD, and the source potential becomes substantially the same as the potential of the first switching element IN_A. Thus, the p-channel field-effect transistor MN is turned off.

Third Embodiment

Figure 6:
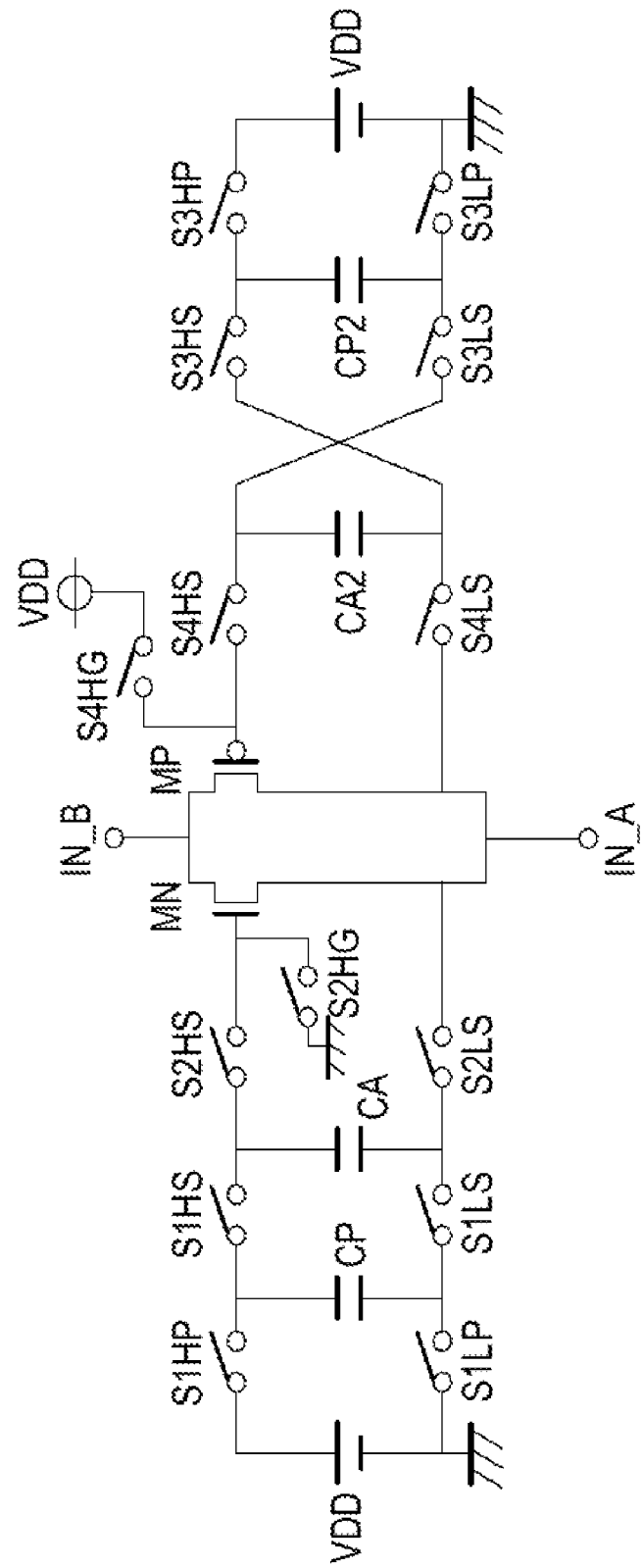
FIG. 6 illustrates an example of an analog switch circuit according to a third embodiment.

FIG. 6 is a circuit diagram illustrating an example of an analog switch circuit according to a third embodiment. The third embodiment adds the analog switch circuit according to the second embodiment to the analog switch circuit according to the first embodiment. Hereunder, points that are different from those of the first embodiment will be described.

A second field-effect transistor MP is a p-channel field-effect transistor, a source of which is coupled to a first switch terminal IN_A and a drain of which is coupled to a second switch terminal IN_B. A third capacitance CP2 and a fourth capacitance CA2 are for storing electric charge. A seventh switching element S3HP is coupled between a DC voltage node of a DC power supply VDD and a first terminal of the third capacitance CP2. An eighth switching element S3LP is coupled between a reference potential node of DC power supply VDD (for example, a ground potential node) and a second terminal of the third capacitance CP2. A ninth switching element S3HS is coupled between the first terminal of the third capacitance CP2 and a second terminal of the fourth capacitance CA2. A tenth switching element S3LS is coupled between the second terminal of the third capacitance CP2 and a first terminal of the fourth capacitance CA2. An eleventh switching element S4HS is coupled between the first terminal of the fourth capacitance CA2 and a gate of the second field-effect transistor MP. A twelfth switching element S4LS is coupled between the second terminal of the fourth capacitance CA2 and the source of the second field-effect transistor MP. A thirteenth switching element S4HG is coupled between the gate of the second field-effect transistor MP and the DC voltage node of the DC power supply VDD.

The third embodiment performs substantially the same operations and achieves substantially the same effects as those of the first and the second embodiments.

Fourth Embodiment

Figure 7:
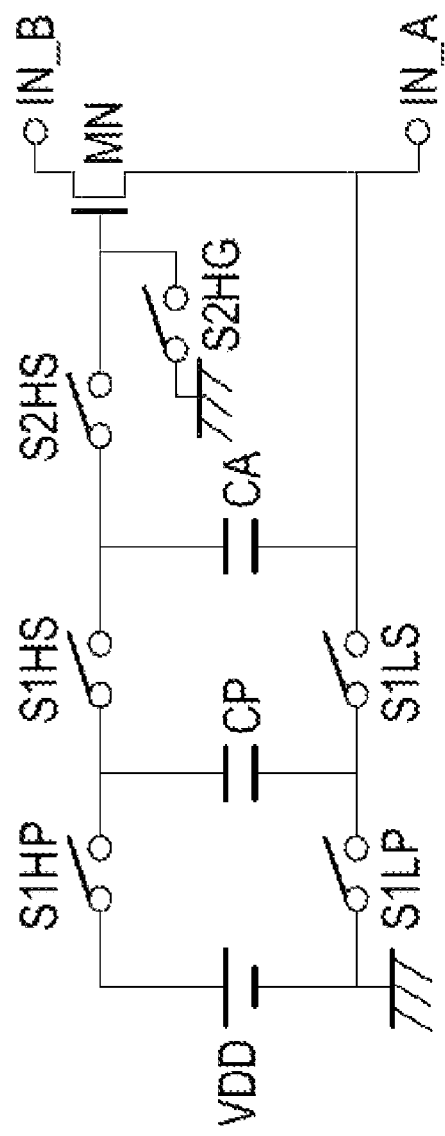
FIG. 7 illustrates an example of an analog switch circuit according to a fourth embodiment.

FIG. 7 is a circuit diagram illustrating an example of an analog switch circuit according to a fourth embodiment. The fourth embodiment removes the sixth switching element S2LS from the analog switch circuit according to the first embodiment, and thereby reduces the area of the analog switch circuit. A second terminal of a second capacitance CA is directly coupled to a source of a first field-effect transistor MN. The fourth embodiment performs substantially the same operation as that of the first embodiment and may achieve substantially the same effects as those of the first embodiment.

Fifth Embodiment

Figure 8:
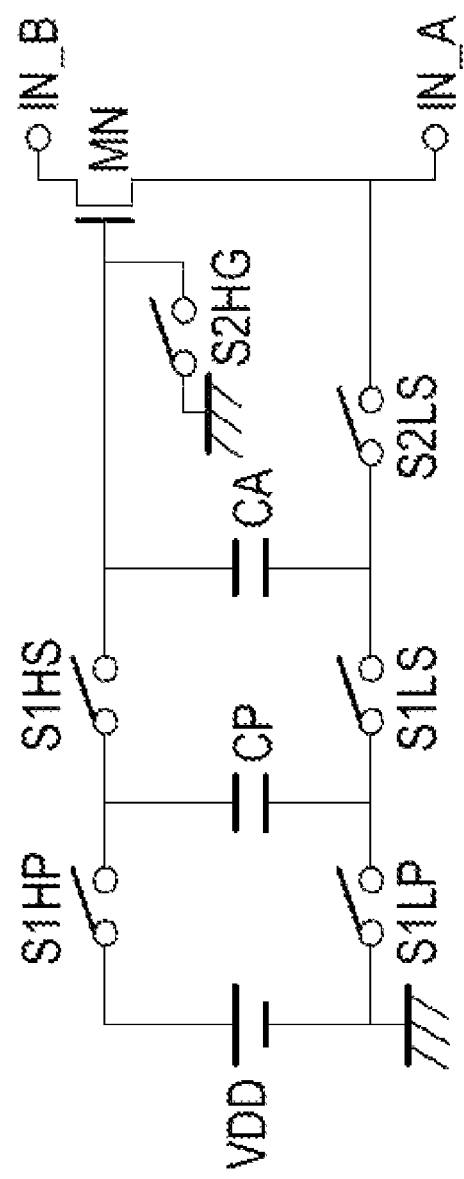
FIG. 8 illustrates an example of an analog switch circuit according to a fifth embodiment.

FIG. 8 is a circuit diagram illustrating an example of an analog switch circuit according to a fifth embodiment. The fifth embodiment removes the fifth switching element S2HS from the analog switch circuit according to the first embodiment, and thereby reduces the area of the analog switch circuit. A first terminal of a second capacitance CA is directly coupled to a gate of a first field-effect transistor MN. The fifth embodiment performs substantially the same operations and may achieve substantially the same effects as those of the first embodiment.

Sixth Embodiment

Figure 9:
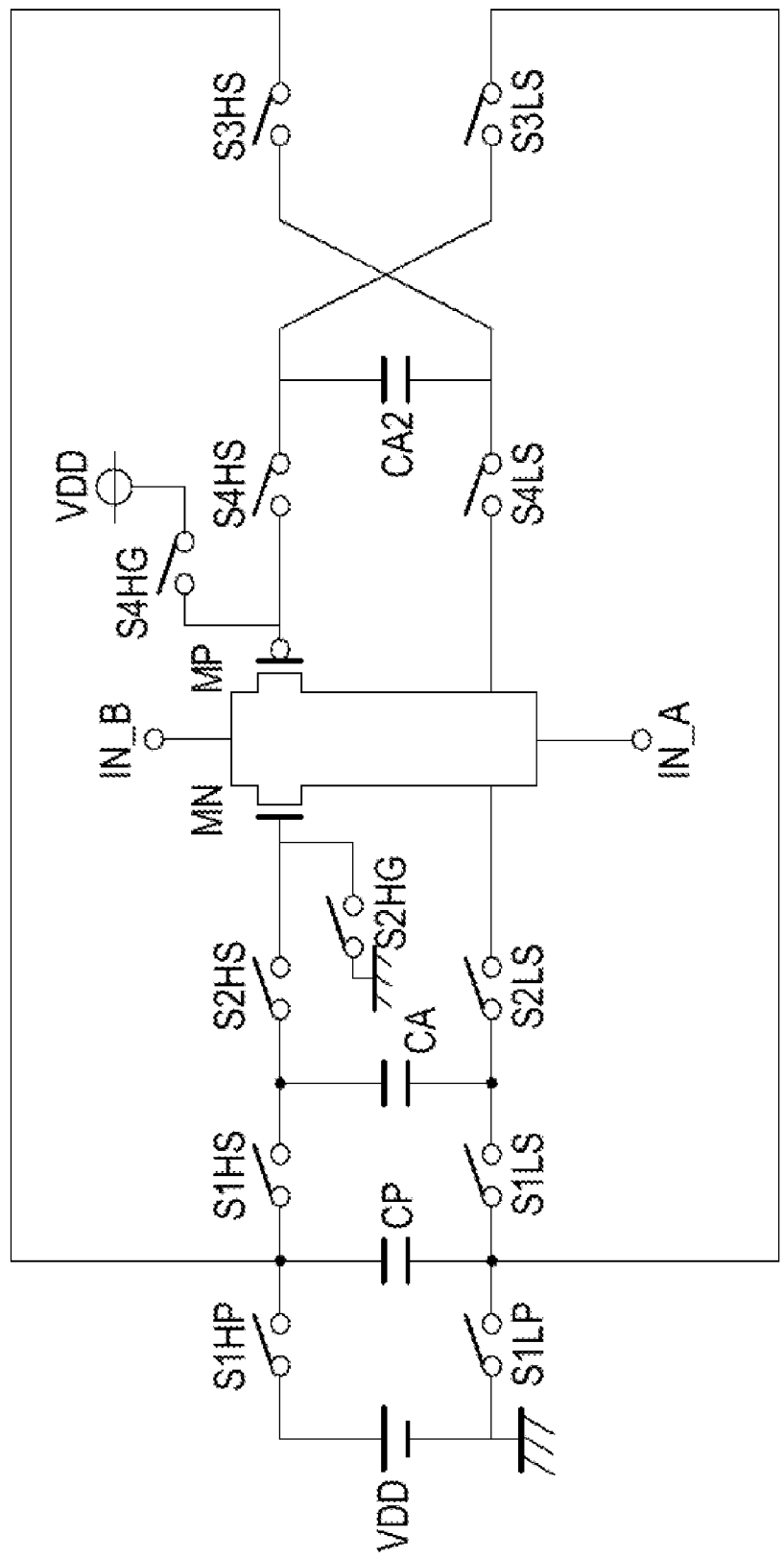
FIG. 9 illustrates an example of an analog switch circuit according to a sixth embodiment.

FIG. 9 is a circuit diagram illustrating an example of an analog switch circuit according to a sixth embodiment. The sixth embodiment, compared with the analog switch circuit according to the third embodiment, the first capacitance CP and the third capacitance CP2 are integrated into a common capacitance, and thereby reduces the area of the analog switch circuit. Hereunder, points that are different from those of the first embodiment will be described.

Elements in the sixth embodiment that are added to the configuration of the first embodiment will be described. A second field-effect transistor MP is a p-channel field-effect transistor, a source of which is coupled to a first switch terminal IN_A, and a drain of which is coupled to a second switch terminal IN_B. A third capacitance CA2 is for storing electric charge. An eighth switching element S3HS is coupled between a first terminal of the first capacitance CP and a second terminal of the third capacitance CA2. A ninth switching element S3LS is coupled between a second terminal of the first capacitance CP and a first terminal of the third capacitance CA2. A tenth switching element S4HS is coupled between the first terminal of the third capacitance CA2 and a gate of the second field-effect transistor MP. An eleventh switching element S4LS is coupled between the second terminal of the third capacitance CA2 and the source of the second field-effect transistor MP. A twelfth switching element S4HG is coupled between the gate of the second field-effect transistor MP and a DC voltage node of a DC power supply VDD.

The first capacitance CP may charge both the second capacitance CA and the third capacitance CA2 by configuring the second capacitance CA and the third capacitance CA2 to not be coupled to a reference potential when the analog switch is in operation.

As described above, the second field-effect transistor MP has a polarity opposite to the first field-effect transistor MN. The eighth switching element S3HS and the ninth switching element S3LS compose a fourth switch circuit for coupling the first capacitance CP and the third capacitance CA2 in parallel. The tenth switching element S4HS and the eleventh switching element S4LS compose a fifth switch circuit for coupling the third capacitance CA2 between the gate and the source of the second field-effect transistor MP. The sixth embodiment performs substantial the same operations and may achieve substantially the same effects as those of the third embodiment.

Seventh Embodiment

Figure 10:
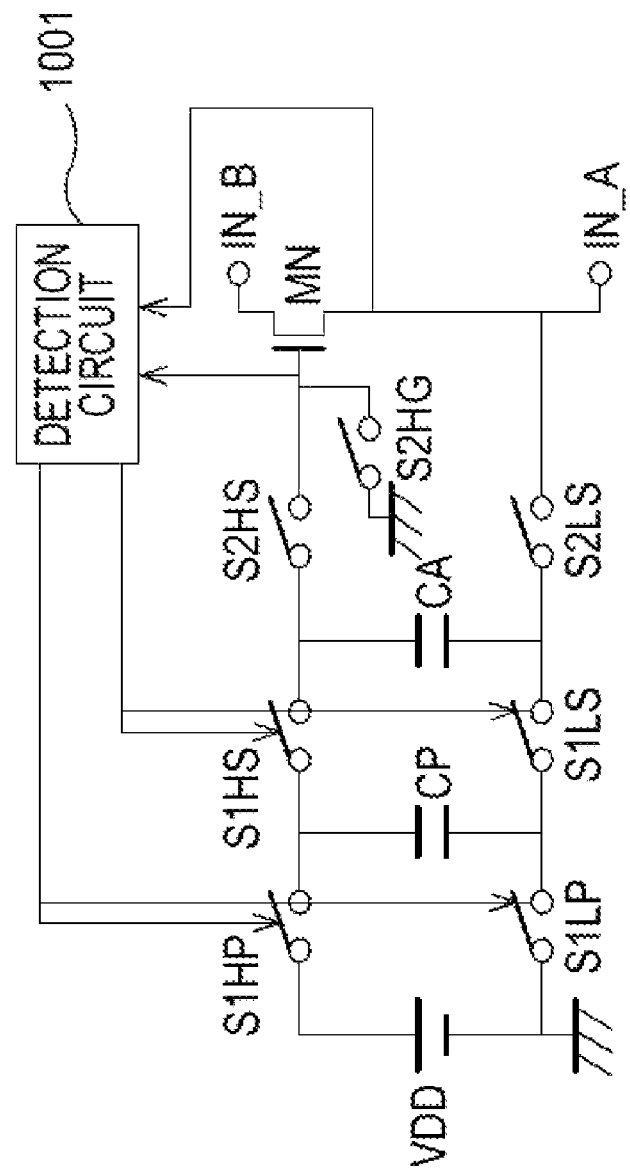
FIG. 10 illustrates an example of an analog switch circuit according to a seventh embodiment.

FIG. 10 is a circuit diagram illustrating an example of an analog switch circuit according to a seventh embodiment. The seventh embodiment adds a detection circuit 1001 to the analog switch circuit according to the first embodiment. Hereunder, points that are different from those of the first embodiment will be described.

The detection circuit 1001 detects a voltage between a gate and a source of a first field-effect transistor MN and controls a first switch circuit (a first switching element S1HP and a second switching element S1LP) and a second switch circuit (a third switching element S1HS and a fourth switching element S1LS) depending on the voltage between the gate and the source of a first field-effect transistor MN.

For example, when a voltage between the gate and the source of the first field-effect transistor MN becomes lower than a threshold, the detection circuit 1001 controls the first switch circuit (the first switching element S1HP and the second switching element S1LP) and the second switch circuit (the third switching element S1HS and the fourth switching element S1LS) as depicted by the state illustrated in FIG. 4B.

Accordingly, charging operation of the first capacitance CP and the second capacitance CA may be substantially optimized. Saving current consumption, substantially optimizing a size of the second capacitance CA, and reducing the area of the analog switch circuit may be achieved as well. Power consumption may be reduced by reducing a frequency of charging the second capacitance CA. The seventh embodiment may achieve substantially the same effects as those of the first and the second embodiments.

Eighth Embodiment

Figure 11:
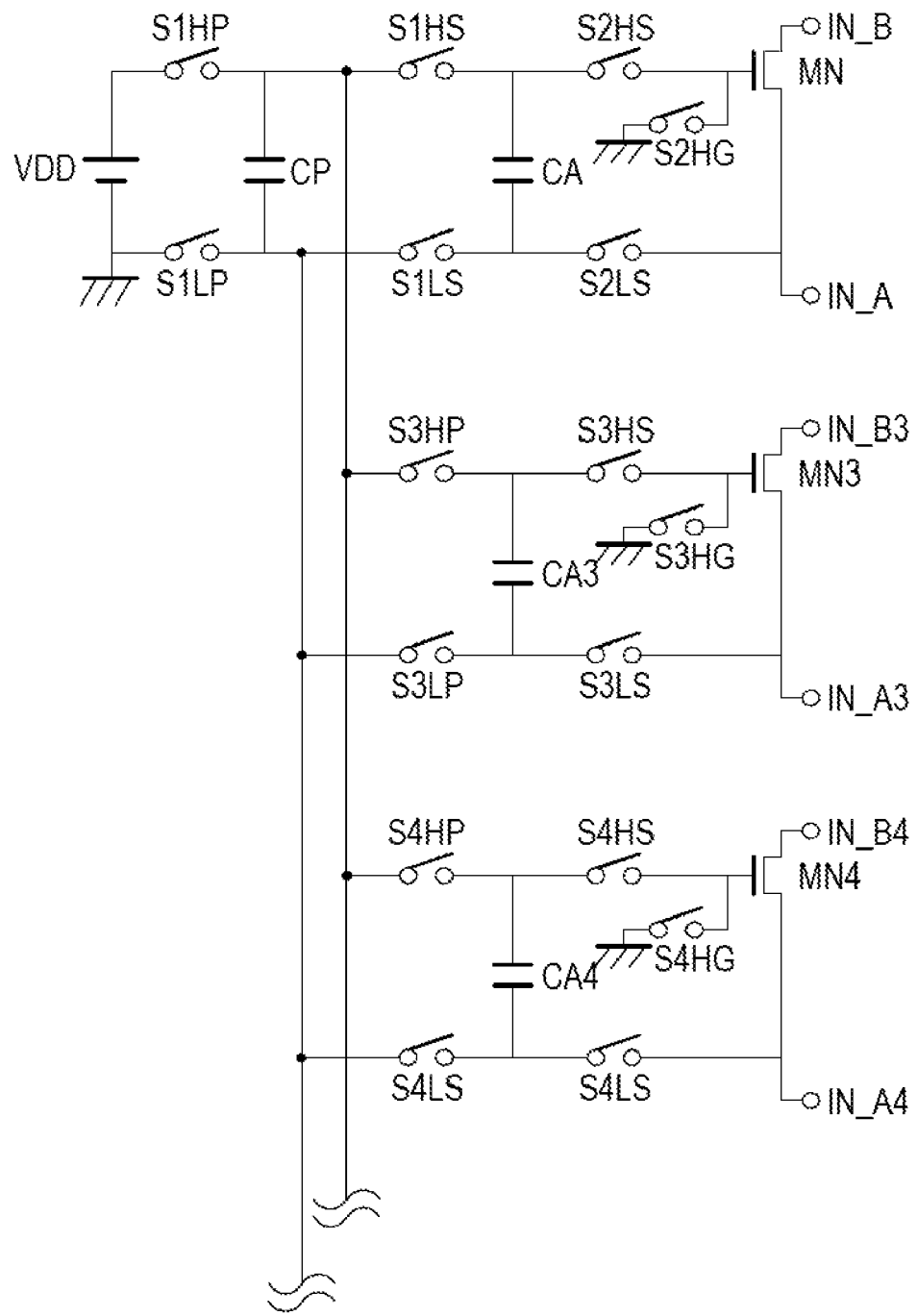
FIG. 11 illustrates an example of an analog switch circuit according to an eighth embodiment.

FIG. 11 is a circuit diagram illustrating an example of an analog switch circuit according to an eighth embodiment. The eighth embodiment provides a plurality of analog switches according to the first embodiment. Hereunder, points that are different from those of the first embodiment will be described. A first field-effect transistor MN is a first analog switch. A second field-effect transistor MN3 is a second analog switch. A third field-effect transistor MN4 is a third analog switch.

Elements in the eighth embodiment that are added to the first embodiment will be described. The second field-effect transistor MN3 is an n-channel field-effect transistor, a source of which is coupled to a third switch terminal IN_A3 and a drain of which is coupled to a fourth switch terminal IN_B3. A third capacitance CA3 is for storing electric charge. An eighth switching element S3HP is coupled between a first terminal of the first capacitance CP and a first terminal of a third capacitance CA3. A ninth switching element S3LP is coupled between a second terminal of the first capacitance CP and a second terminal of the third capacitance CA3. A tenth switching element S3HS is coupled between the first terminal of the third capacitance CA3 and a gate of the second field-effect transistor MN3. An eleventh switching element S3LS is coupled between the second terminal of the third capacitance CA3 and the source of the second field-effect transistor MN3. A twelfth switching element S3HG is coupled between the gate of the second field-effect transistor MN3 and a reference potential node.

The eighth switching element S3HP and the ninth switching element S3LP compose a fourth switch circuit for coupling the first capacitance CP and the third capacitance CA3 in parallel. The tenth switching element S3HS and the eleventh switching element S3LS compose a fifth switch circuit for coupling the third capacitance CA3 between the gate and the source of the second field-effect transistor MN3. An analog signal passes through between the third switch terminal IN_A3 and the fourth switch terminal IN_B3 when the second field-effect transistor MN3 is turned on.

The third field-effect transistor MN4 is an n-channel field-effect transistor, a source of which is coupled to a fifth switch terminal IN_A4 and a drain of which is coupled to the sixth switch terminal IN_B4. A fourth capacitance CA4 is for storing electric charge. A thirteenth switching element S4HP is coupled between the first terminal of the first capacitance CP, and a first terminal of the fourth capacitance CA4. A fourteenth switching element S4LP is coupled between the second terminal of the first capacitance CP and a second terminal of the fourth capacitance CA4. A fifteenth switching element S4HS is coupled between the first terminal of the fourth capacitance CA4 and the gate of the third field-effect transistor MN4. A sixteenth switching element S4LS is coupled between the second terminal of the fourth capacitance CA4 and a source of the third field-effect transistor MN4. A seventeenth switching element S4HG is coupled between the gate of the third field-effect transistor MN4 and a reference potential node.

The thirteenth switching element S4HP and the fourteenth switching element S4LP compose a sixth switch circuit for coupling the first capacitance CP and the fourth capacitance CA4 in parallel. The fifteenth switching element S4HS and the sixteenth switching element S4LS compose a seventh switch circuit for coupling the fourth capacitance CA4 between the gate and the source of the third field-effect transistor MN4. An analog signal passes through between the fifth switch terminal IN_A4 and the sixth switch terminal IN_B4 when the third field-effect transistor MN4 is turned on.

The example in which three analog switches are provided is described as above. Four analog switches or more may be provided in a similar manner. The plurality of analog switches may be individually controlled to be turned on and off. The plurality of analog switches may share the first capacitance CP, and thereby the numbers of the first capacitance, the first switching element S1HP, and the second switching element S1LP may be decreased, and thereby the area of the analog switch circuit may be reduced.

Ninth Embodiment

Figure 12:
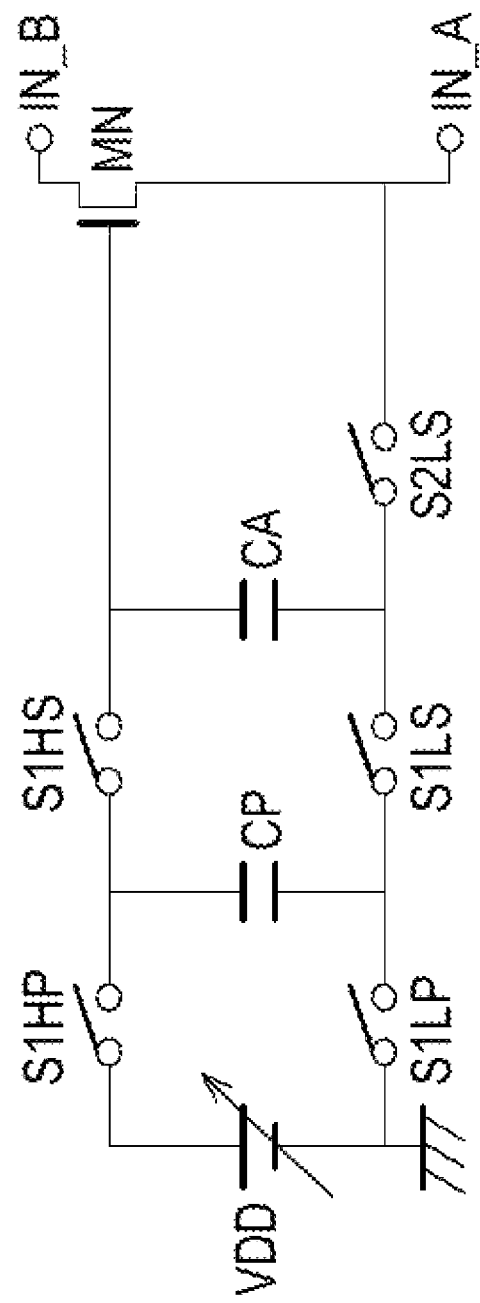
FIG. 12 illustrates an example of an analog switch circuit according to a ninth embodiment.

FIG. 12 is a circuit diagram illustrating an example of an analog switch circuit according to a ninth embodiment. The ninth embodiment provides a variable DC power supply VDD in addition to the analog switch circuit according to the first embodiment. Hereunder, points that are different from those of the first embodiment will be described.

A direct current voltage node of the variable DC power supply VDD is coupled to a first terminal of a first capacitance CP through a first switching element S1HP and a reference potential node of the variable DC power supply VDD is coupled to a second terminal of the first capacitance CP through a second switching element S1LP. The variable DC power supply VDD supplies a variable DC voltage. The variable DC power supply VDD may supply a direct current voltage and 0 V to a gate of the first field-effect transistor MN. Thus, the fifth switching element S2HS and the seventh switching element S2HG illustrated in FIG. 3 may be removed, and thereby the area of the analog switch circuit may be reduced.

A first terminal of a second capacitance CA is directly coupled to the gate of the first field-effect transistor MN. The analog switch circuit may be turned to an off-state by turning on the switching elements S1HP and S1HS and the variable DC power supply VDD supplies 0 V to the gate of the first field-effect transistor MN. An on-state of the analog switch circuit in FIG. 12 is substantially the same as that of the first embodiment. Detailed operation of the circuit will be described later by referring to FIG. 14.

The variable DC power supply VDD enables variation of the gate voltage of the first field-effect transistor MN, and thereby resistance of the first field-effect transistor MN may be controlled. Hence, the first field-effect transistor MN may function as variable resistance.

Tenth Embodiment

Figure 13:
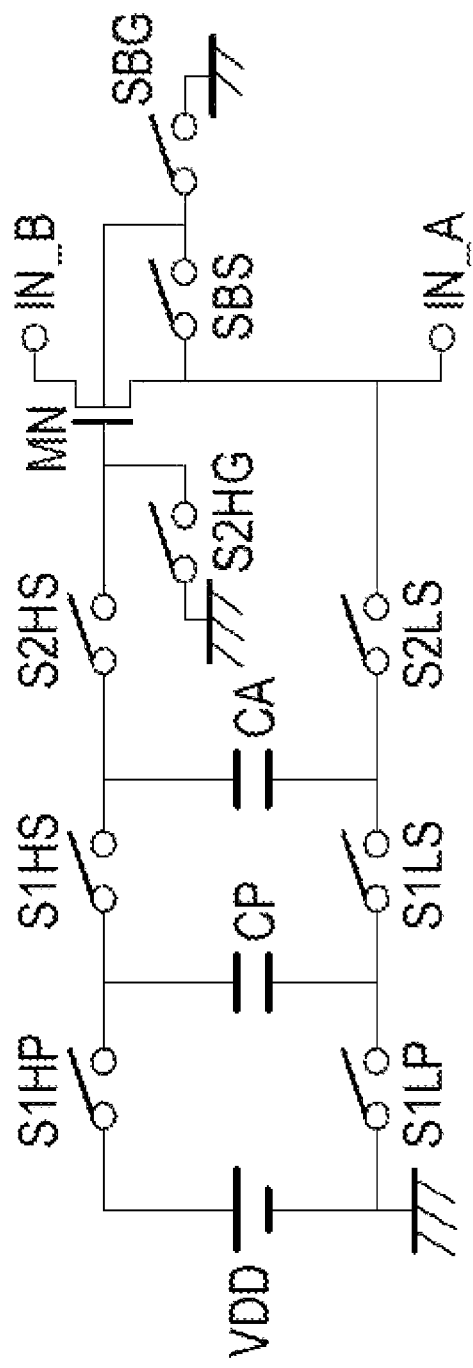
FIG. 13 illustrates an example of an analog switch circuit according to a tenth embodiment.

FIG. 13 is a circuit diagram illustrating an example of an analog switch circuit according to a tenth embodiment. The tenth embodiment adds an eighth switching element SBS and a ninth switching element SBG to the analog switch circuit according to the first embodiment. Hereunder, points that are different from those of the first embodiment will be described.

The eighth switching element SBS is coupled between a back gate and a source of a first field-effect transistor MN. The ninth switching element SBG is coupled between the back gate of the first field-effect transistor MN and a reference potential node. The eighth switching element SBS and the ninth switching element SBG compose a back gate switch circuit for coupling the back gate of the first field-effect transistor MN to the source or a reference potential node.

When the first field-effect transistor MN is in an on-state, the eighth switching element SBS is turned on and the ninth switching element SBG is turned off. When the first field-effect transistor MN is in an off-state, the eighth switching element SBS is turned off and the ninth switching element SBG is turned on. ON-resistance of the first field-effect transistor MN may be slightly changed due to an influence of a voltage between a gate and the back gate even if a voltage between the gate and the source is substantially constant.

The influence of the voltage between the gate and the back gate may be removed by making potential of the back gate substantially the same as the potential of the first switch terminal IN_A when the first field-effect transistor MN is in an on-state. Removing the above-described influence of the back gate allows maintaining ON-resistance of the first field-effect transistor MN more constant, thus further reducing distortion characteristics of a signal.

Eleventh Embodiment

Figure 14:
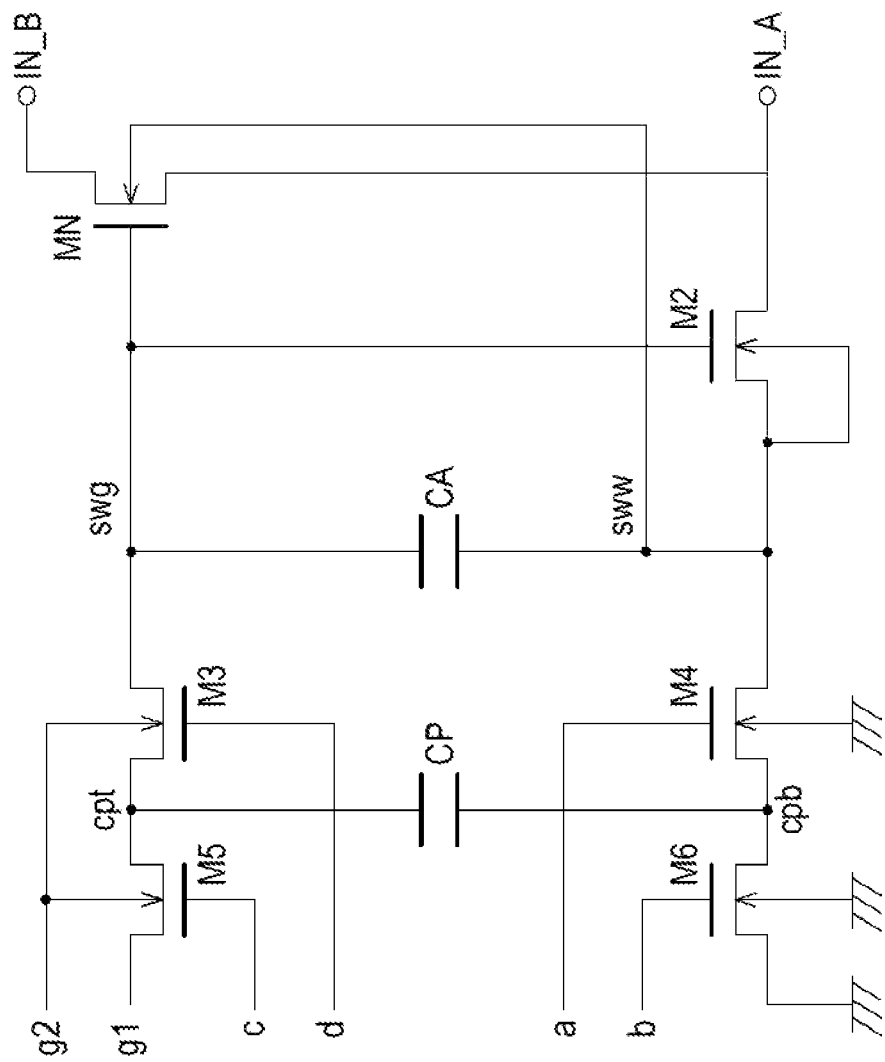
FIG. 14 illustrates an example of an analog switch circuit according to an eleventh embodiment.
Figure 15:
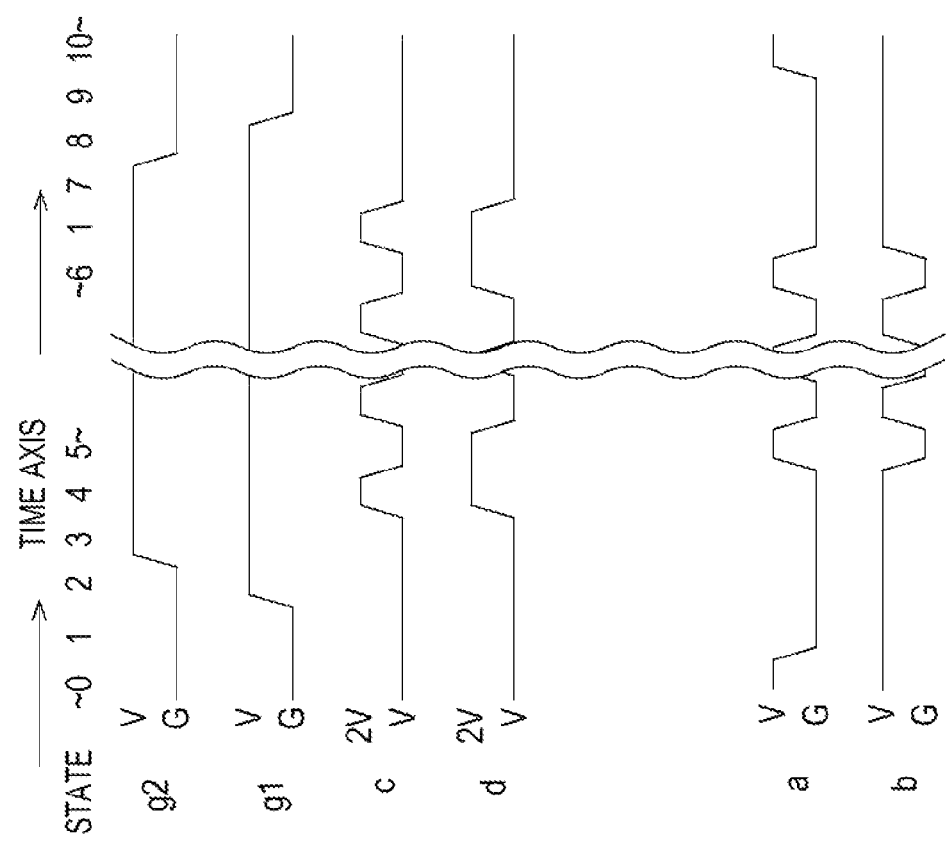
FIG. 15 is a timing chart illustrating an operation example of the analog switch circuit illustrated in FIG. 14.
Figure 16:
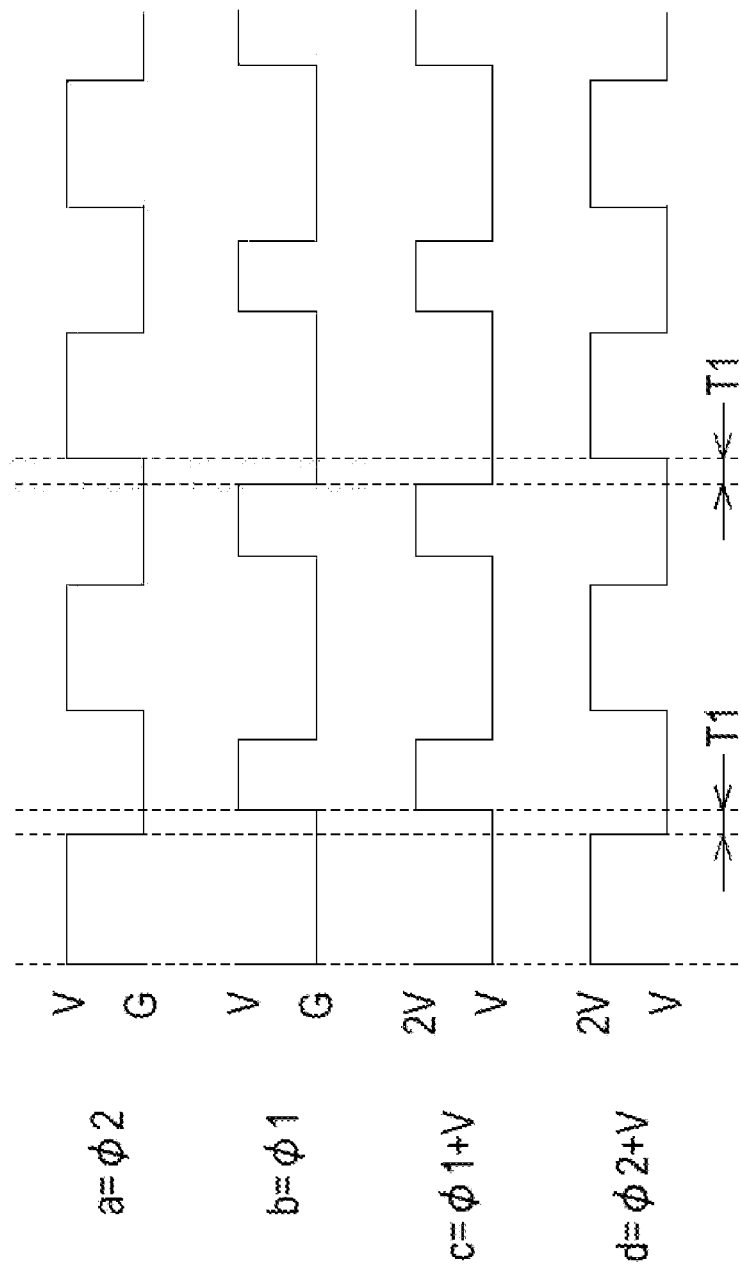
FIG. 16 is an enlarged view of a part of the timing chart illustrated in FIG. 15.

FIG. 14 is a circuit diagram illustrating an example of an analog switch circuit according to an eleventh embodiment. FIG. 15 is a timing chart illustrating an operation example of the analog switch circuit illustrated in FIG. 14. FIG. 16 is an enlarged view of a part of the timing chart illustrated in FIG. 15. The eleventh embodiment represents a more specific example of the analog switch circuit according to the ninth embodiment. Hereunder, points that are different from those of the ninth embodiment will be described.

An n-channel filed-effect transistor M5 corresponds to the first switching element S1HP illustrated in FIG. 12, a gate of which is coupled to a signal line c, a back gate of which is coupled to a signal line g2, a source of which is coupled to a signal line g1 and a drain of which is coupled to a first terminal cpt of a first capacitance CP. The signal line g1 is coupled to a variable DC power supply VDD.

An n-channel filed-effect transistor M6 corresponds to the second switching element S1LP illustrated in FIG. 12, a gate of which is coupled to a signal line b, a back gate of which is coupled to a referential potential node (a ground potential node), a source of which is coupled to a reference potential node and a drain of which is coupled to a second terminal cpb of the first capacitance CP.

An n-channel filed-effect transistor M3 corresponds to the third switching element S1HS illustrated in FIG. 12, a gate of which is coupled to a signal line d, a back gate of which is coupled to a signal line g2, a source of which is coupled to the first terminal cpt of the first capacitance CP, and a drain of which is coupled to a first terminal swg of the second capacitance CA.

An n-channel field-effect transistor M4 corresponds to the fourth switching element S1LS illustrated in FIG. 12, a gate of which is coupled to a signal line a, a back gate of which is coupled to a referential potential node, a source of which is coupled to the second terminal cpb of the first capacitance CP and a drain of which is coupled to a second terminal sww of the second capacitance CA.

An n-channel filed-effect transistor M2 corresponds to the sixth switching element S2LS illustrated in FIG. 12, a gate of which is coupled to the first terminal swg of the second capacitance CA, a back gate of which is coupled to a source of the n-channel filed-effect transistor M2, the source of which is coupled to the second terminal sww of the second capacitance CA and a drain of which is coupled to a first switch terminal IN_A.

A first field-effect transistor MN is an n-channel filed-effect transistor, a gate of which is coupled to the first terminal swg of the second capacitance CA, a back gate of which is coupled to the second terminal sww of the second capacitance CA, a source of which is coupled to the first switching element IN_A, and a drain of which is coupled to a second switch terminal IN_B.

In FIG. 15, a potential G indicates a ground potential (reference potential), voltage V indicates a positive DC power supply voltage of a variable DC power supply VDD, and voltage 2 V indicates voltage of 2×V. A state 0 and a state 10 indicates an off-state of the analog switch circuit, while states 1 to 9 indicate an on-state of the analog switch circuit.

A state 0 will be described. Potentials of the signal line g1 and the signal line g2 are at ground potential G. The transistor M5 is turned on because a voltage of the signal line c is V. The transistor M3 is turned on because a voltage of a signal line d is V. A potential of the first terminal swg of the second capacitance CA and a potential of the gate of the transistor MN become a ground potential. The transistor M4 is turned on because a voltage of the signal line a is V. The transistor M6 is turned on because a voltage of the signal line b is V. A potential of the second terminal sww of the second capacitance CA becomes ground potential. The transistors M2 and MN are turned off, and thereby the transistor MN blocks analog signals between the first switch terminal IN_A and the second switch terminal IN_B.

The states 1 to 9 indicate an on-state of the analog switch circuit. In the state 1, a potential of the signal line a becomes ground potential G. In the state 2, a voltage of the signal line g1 becomes V. In the state 3, a voltage of the signal line g2 becomes V. In the state 4, both voltages of the signal line c and the signal line d become 2 V. The above described states 1 to 4, and 6 to 9 are the states that are desirable in order to reduce and/or prevent breakdown of transistors M3 and M5 when a breakdown voltage of the transistors M3 and M5 is a voltage V. The states 1 to 4 and 6 to 9 are not required when a breakdown voltage of the transistors M3 and M5 is 2 V. A voltage of the signal line g2 may be 0 V (GND) when a breakdown voltage of the transistors M3 and M5 is 2 V. Similarly, the signal lines c and d may be operated between 0 V to 2 V.

In the state 5, as illustrated in FIG. 16, a signal φ2 is supplied to the signal line a, and a signal φ1 is supplied to the signal line b. A signal φ1+V in which a voltage V is added to the signal φ1 is supplied to the signal line c. A signal φ2+V in which a voltage V is added to the signal φ2 is supplied to the signal line d. The signal φ1 and the signal φ2 have opposite phases and have a high-level prohibition period T1 in which both signals are not allowed to become high-levels but become low levels. As a result, a state corresponding to FIG. 4A and a state corresponding to FIG. 4B are alternately repeated. In the state corresponding to FIG. 4A, the transistors M5 and M6 are turned on and the transistors M3 and M4 are turned off. In the state corresponding to FIG. 4B, the transistors M5 and M6 are turned off, and the transistor M3 and the transistor M4 are turned on. By alternately repeating the states corresponding to FIGS. 4A and 4B, the first field-effect transistor MN is turned on as in the first embodiment to allow passing analog signals between the first switch terminal IN_A and the second switch terminal IN_B. A voltage between the gate and the source of the first field-effect transistor MN becomes substantially constant, ON-resistance becomes substantially constant as well, and thereby distortion in signals may be reduced.

States 6 to 9 are performed in order to change a state of the analog switch circuit from an on-state to an off state. The states 6 to 9 perform operations opposite to the above states 1 to 4. In the state 6, voltages of the signal line c and the signal line d become voltage 2V. In the state 7, voltages of the signal line c and the signal line d becomes voltage V. In the state 8, a potential of signal line g2 becomes the ground potential G. In the state 9, a potential of the signal line g1 becomes the ground potential G.

The state 10 is substantially the same as the state 0, and the analog switch circuit is turned to an off state.

As described above, the embodiment of an analog switch circuit that performs switching operation between the first switch terminal IN_A and the second switch terminal IN_B through the signal lines a, b, c, d, g1, and g2.

An operation of a switch off period in a state 0 and a state 10 will be described. Potentials during the switch off period is assumed to be a=b=c=d=V, and g1=g2=G. At this time, all of the transistors M3, M4, M5, and M6 are turned on, and the first terminal swg and the second terminal sww of the second capacitance CA are shorted to a ground potential G. Thus, both transistors MN and M2 are turned off and a line between the first switching terminal IN_A and the second switching terminal IN_B is in an off state as well. Both the capacitance CP and the capacitance CA are discharged in this state.

An operation when a switch is turned on will be described. Potentials in the state 5 when the switch is turned on are, a=φ2, b=φ1, c=φ1+V, d=φ2+V, and g1=g2=V. The signal φ1 and the signal φ2 are controlled to not overlap so that the two signals φ1 and φ2 do not become high-level simultaneously. The transistors M5 and M6 are turned on and the first capacitance CP is charged when the signal φ1 is at a high-level and the signal φ2 is at a low-level. The transistors M3 and M4 are turned on and the voltage in the first capacitance CP is charged to the second capacitance CA when the signal φ1 is at a low-level and the signal φ2 is at a high-level. Repeating operations alternately by the signal φ1 and the signal φ2 continuously stores electric charge in the second capacitance CA, and maintains the potential to the potential of the first terminal swg=(a potential of the second terminal sww+V). The transistor M2 is turned on through the first terminal swg that makes a potential of the first switch terminal IN_A=a potential of the second terminal sww. Thus, a voltage between the gate and the source of the transistor MN becomes continuously V. As a result, the first switch terminal IN_A and the second switch terminal IN_B are kept on under a condition in which a bias is substantially constant. The embodiment may achieve substantially the same effects as those of the ninth embodiment.

Twelfth Embodiment

Figure 17:
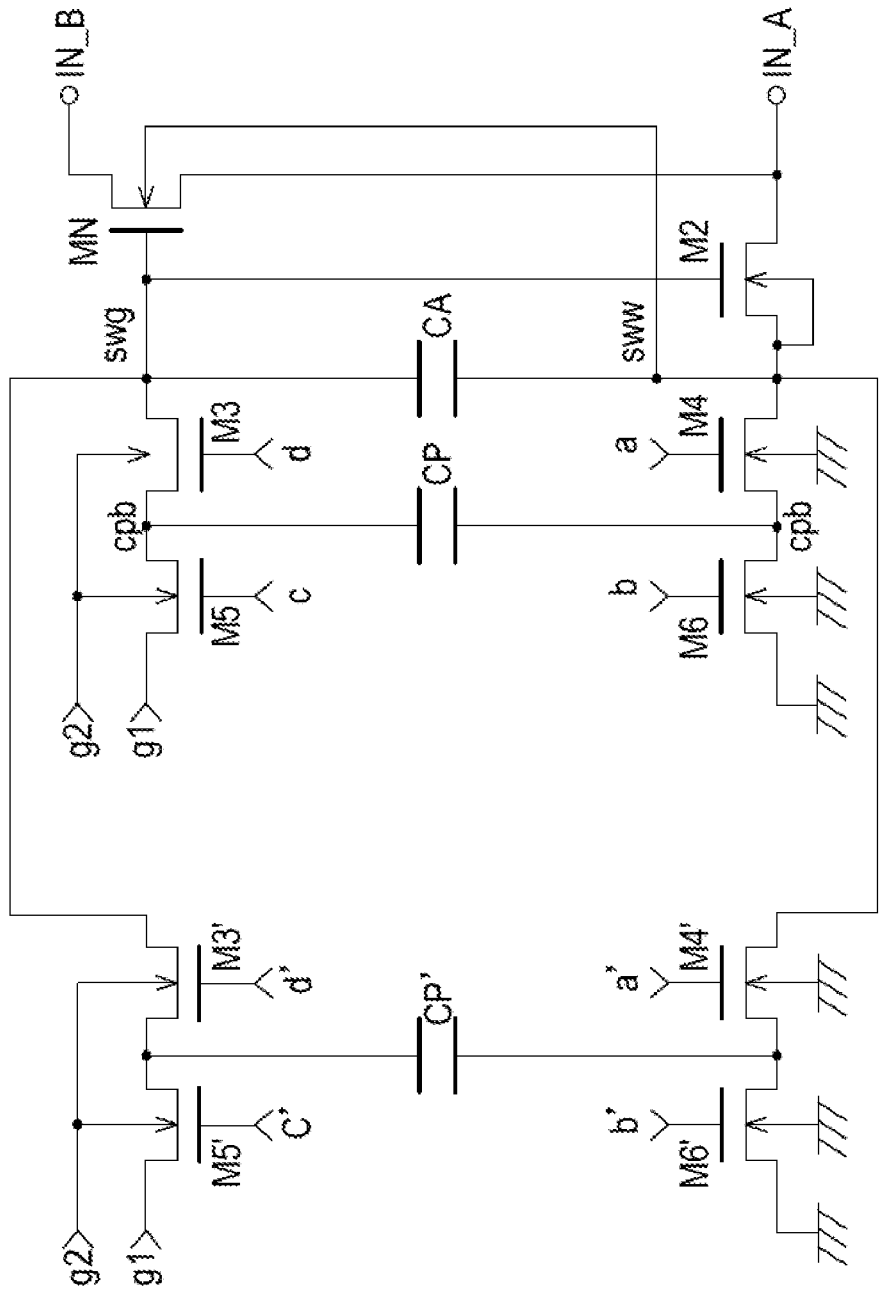
FIG. 17 is a circuit diagram illustrating an example of an analog switch circuit according to a twelfth embodiment.
Figure 18:
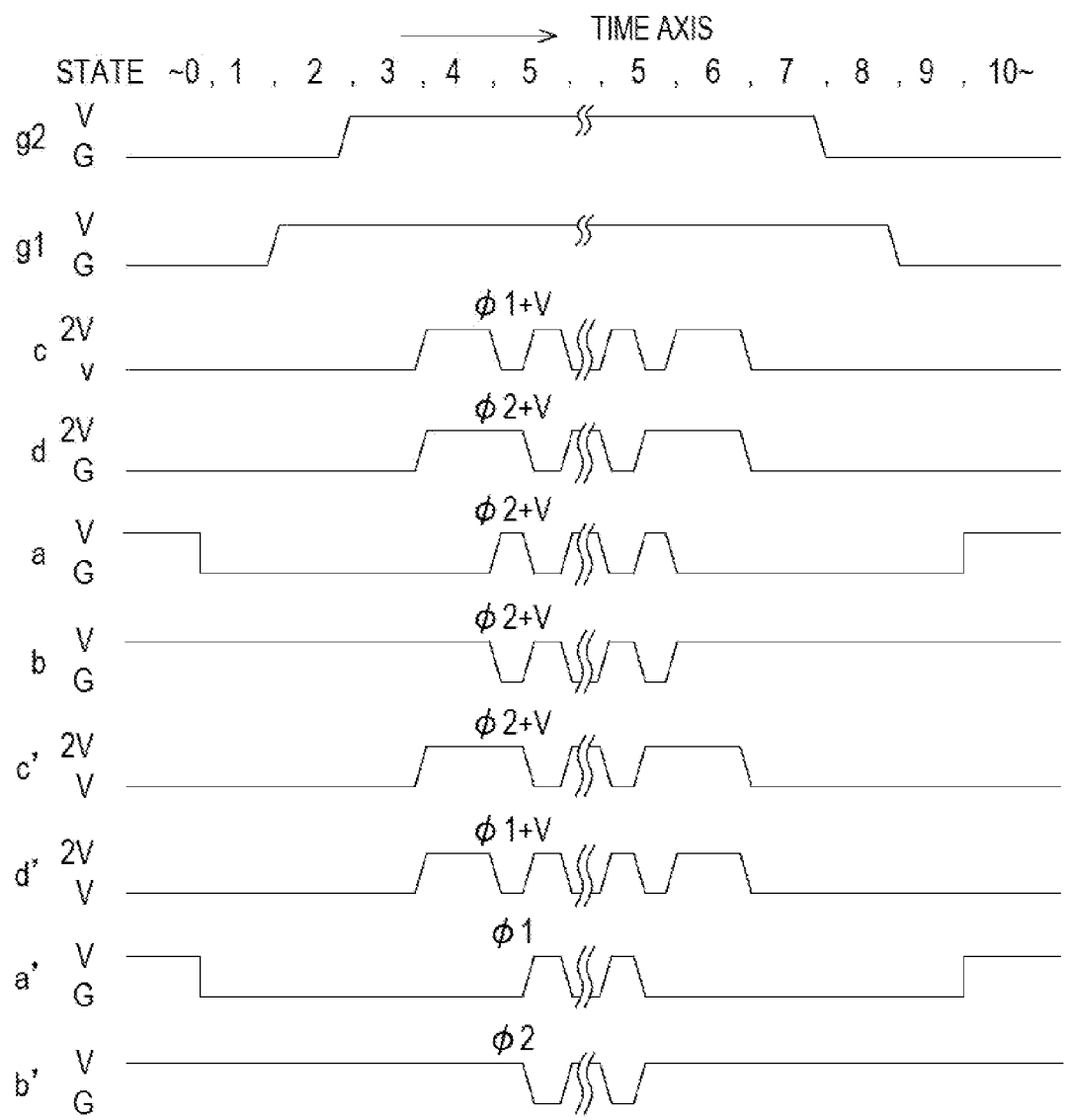
FIG. 18 is a timing chart illustrating an operation example of the analog switch circuit illustrated in FIG. 17.

FIG. 17 is a circuit diagram illustrating an analog switch circuit according to a twelfth embodiment. FIG. 18 is a timing chart illustrating an operation example of the analog switch circuit illustrated in FIG. 17. The twelfth embodiment adds transistors M3' to M6' and a capacitance CP' to the analog switch circuit according to the eleventh embodiment. Hereunder, points that are different from those of the eleventh embodiment will be described.

In FIG. 14, a signal of a signal line d, φ2+V may leak to the first switch terminal IN_A through the capacitance between the gate and the drain of the transistor M3 and the gate and the drain of the transistor MN. In other words, a voltage between the gate and the source of the transistor MN that functions as a main switch may fluctuate, though slightly, due to charge redistribution generated at on/off of the transistor M3. The fluctuated voltage may leak to a signal path of the switch. In the twelfth embodiment, an analog switch circuit that addresses the above-described possible drawback will be described.

A third capacitance CP' is for storing electric charge. An n-channel field-effect transistor M5' corresponds to the n-channel field-effect transistor M5, a gate of which is coupled to a signal line c', a back gate of which is coupled to a signal line g2, a source of which is coupled to a signal line g1, and a drain of which is coupled to a first terminal of the third capacitance CP'.

An n-channel field-effect transistor M6' corresponds to the n-channel field-effect transistor M6, a gate of which is coupled to a signal line b', a back gate of which is coupled to a reference potential node, a source of which is coupled to a reference potential node, and a drain of which is coupled to a second terminal of the third capacitance CP'.

The n-channel field-effect transistor M3' corresponds to the n-channel field-effect transistor M3, a gate of which is coupled to a signal line d', and a back gate of which is coupled to the signal line g2, a source of which is coupled to a first terminal of the third capacitance CP', and a drain of which is coupled to a first terminal swg of a second capacitance CA.

An n-channel field-effect transistor M4' corresponds to the n-channel field-effect transistor M4, a gate of which is coupled to a signal line a', a back gate of which is coupled to a reference potential node, a source of which is coupled to a second terminal of the third capacitance CP', and a drain of which is coupled to a second terminal sww of the second capacitance CA.

In FIG. 18, the signal lines, g2, g1, c, d, a, and b are substantially the same as those illustrated in FIG. 15. Except for a state 5, signals of signal lines c', d', a', and b' are substantially the same as those of signal lines c, d, a, and b. In the state 5, signals of signal lines c', d', a', and b' have opposite phases to signals of the signal lines c, d, a, and b respectively. In other words, in the state 5, a signal $\phi1+V$ is supplied to the signal line c, a signal $\phi2+V$ is supplied to the signal line d, a signal $\phi2$ is supplied to the signal line a, a signal $\phi1$ is supplied to the signal line b, a signal $\phi2+V$ is supplied to the signal line c', a signal $\phi1+V$ is supplied to the signal line d', a signal $\phi1$ is supplied to the signal line a', and a signal $\phi2$ is supplied to the signal line b'. The signal $\phi1$ and the signal $\phi2$ are non overlapping signals with opposite phases in which the two signals do not become a high-level simultaneously.

The twelfth embodiment is an analog switch circuit that performs switching operations between the first switch terminal IN_A and the second switch terminal IN_B using signal lines a', b', c' and d' in addition to signal lines a, b, c, and d according to the eleventh embodiment. Signals of signal lines a', b', c' and d' are substantially the same as those of signal lines a, b, c, and d. However, in the state 5, the signals of signal lines a', b', c' and d' have opposite phases to the signals of the signal lines a, b, c, and d.

According to the twelfth embodiment, effects of charge redistribution are cancelled out, because the transistor M3 and the transistor M3' are alternately turned on/off. Thus, clock leakage to a signal path may be reduced.

As described above, the signal of the signal line d, $\phi2+V$ has an opposite phase to the signal of the signal line d', $\phi1+V$, thus the signals are cancelled out. In other words, the operation of the transistor M3 and that of M3' are cancelled out. As a result, fluctuations in the voltage between the gate and the source of the transistor MN may be reduced and/or prevented, and thereby distortion of signals that pass through the transistor MN may be further reduced.

Making a duty ratio of the signal $\phi1$ and the signal $\phi2$ to approximately 50% operates a charge pump under the state 5 for each half of the clock cycle. Hence, the second capacitance CA may be alternately coupled to the first capacitance CP and the third capacitance CP'. As a result, a charge period may be cut in half, and the twelfth embodiment may reduce the capacitance value of the capacitance CP and the capacitance CA to approximately half of those of the eleventh embodiment. The embodiment may achieve substantially the same effects as those of the eleventh embodiment.

Thirteenth Embodiment

Figure 19:
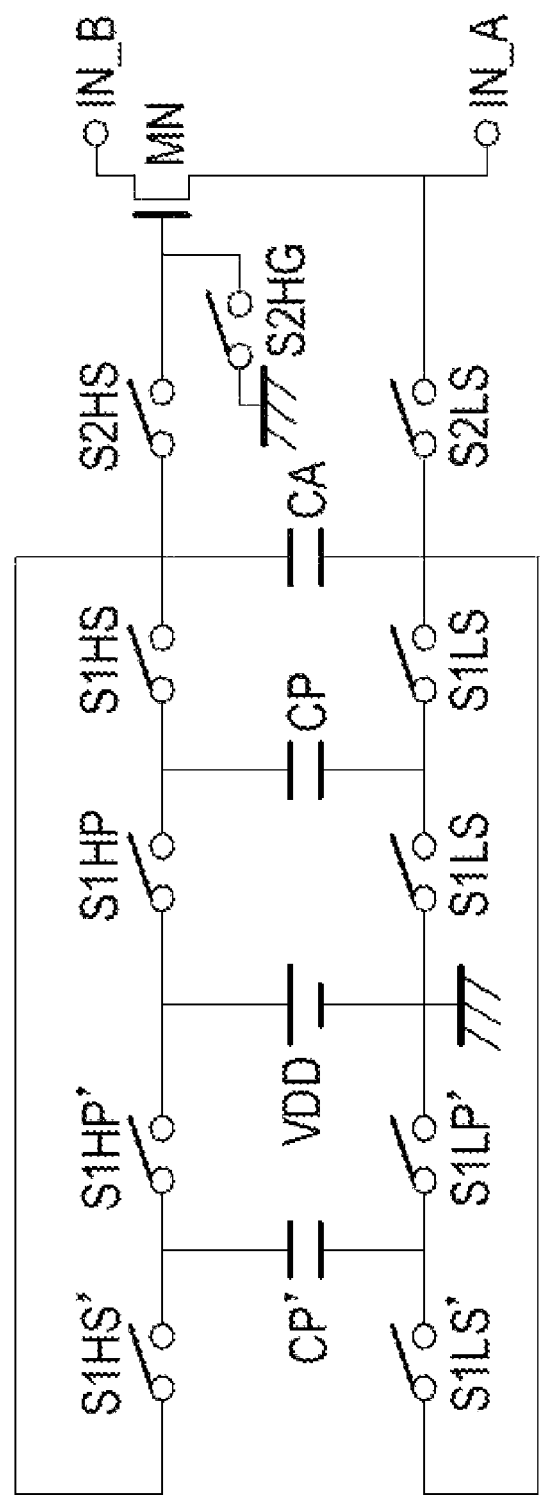
FIG. 19 is a circuit diagram illustrating an example of an analog switch circuit according to the thirteenth embodiment.

FIG. 19 is a circuit diagram illustrating an example of an analog switch circuit according to the thirteenth embodiment and illustrating the analog switch circuit of a higher concept of the twelfth embodiment. The thirteenth embodiment adds switching elements S1HS', S1LS', S1HP', and S1LP' and a capacitance CP' to the first embodiment. Hereunder, points that are different from those of the first embodiment will be described.

A third capacitance CP' is for storing electric charge. The eighth switch element S1HP' corresponds to the transistor M5' illustrated in FIG. 17 and is coupled between a DC voltage node of a DC power supply VDD, and a first terminal of the third capacitance CP'. A ninth switching element S1LP' corresponds to the transistor M6' illustrated in FIG. 17 and is coupled between a reference voltage node of the DC power supply VDD, and a second terminal of the third capacitance CP'. A tenth switching element S1HS' corresponds to the transistor M3' illustrated in FIG. 17 and is coupled between the first terminal of the third capacitance CP', and a first terminal of a second capacitance CA. An eleventh switching element S1LS' corresponds to the transistor M4' illustrated in FIG. 17 and is coupled between the second terminal of the third capacitance CP', and a second terminal of the second capacitance CA.

The eighth switching element S1HP' and the ninth switching element S1LP' compose a fourth switch circuit for coupling the third capacitance CP' between a DC voltage node of the DC power supply VDD and a reference potential node. The tenth switching element S1HS' and the eleventh switching element S1LS' compose a fifth switch circuit for coupling the second capacitance CA and the third capacitance CP' in parallel. The operation of the thirteenth embodiment is substantially the same as that of the twelfth embodiment.

The thirteenth embodiment cancels out clock signals that may leak between the gate and the source of the transistor MN, thereby reducing and/or preventing leakage to signal lines by using the third capacitance CP' that is charged at an opposite phase to that of the first capacitance CP.

In the first embodiment, a voltage between the gate and the source of the transistor MN that functions as a main switch may fluctuate, though slightly, due to charge redistribution generated at on/off of the third switching element S1HS. The fluctuated voltage may leak to a signal path of the switch. The thirteenth embodiment allows reduction and/or prevention of the leakage.

In the state 5, signal lines a', b', c', and d' supply signals with opposite phases to signals of signal lines a, b, c, and d. Therefore, on/off operations of switching elements S1HP', S1LP', S1HS', and S1LS' are opposite to on/off operations of switching elements S1HP, S1LP, S1HS, and S1LS. As a result, effects of charge redistribution are cancelled out and clock leakage to signal paths may be reduced and/or prevented. Under the state 5, a charge pump operates for each half of the clock cycle. Thus, the thirteenth embodiment reduces a capacitance value of the capacitance CP, CP', and CA to approximately half of those of the first embodiment, and reduces the chip area as well. The thirteenth embodiment may achieve the same effects as those of the twelfth embodiment.

Any of the first to thirteenth embodiments described above may be incorporated into a large scale integrated circuit (LSI). For example, one or more of the above described circuits may be implemented in an audio LSI incorporated within a mobile phone, personal digital assistant, etc.

As described above, according to the first to thirteenth embodiments, a voltage between the gate and the source of the first field-effect transistor MN may be maintained substantially constant, thus ON-resistance of the first field-effect transistor MN may be maintained substantially constant. Moreover, ON-resistance may be maintained substantially constant over a wide frequency band of a continuous input signal. As a result, distortion in an input signal waveform may be reduced even when an input signal voltage changes.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

The invention claimed is:

1. An analog switch circuit comprising:
    a first field-effect transistor, a source of which is coupled to a first switch terminal, and a drain of which is coupled to a second switch terminal;
    a first capacitance to store electric charge;
    a second capacitance to store electric charge;
    a first switching element that is coupled between the direct current voltage node and a first terminal of the first capacitance;
    a second switching element that is coupled between the reference potential node and a second terminal of the first capacitance;
    a third switching element that is coupled between the first terminal of the first capacitance and a first terminal of the second capacitance;
    a fourth switching element that is coupled between the second terminal of the first capacitance and a second terminal of the second capacitance;
    a fifth switching element that is coupled between the first terminal of the second capacitance and a gate of the first field-effect transistor; and
    a sixth switching element that is coupled between the second terminal of the second capacitance and the source of the first field-effect transistor.

2. The analog switch circuit according to claim 1, further comprising:
    a second field-effect transistor with a polarity opposite to the first field-effect transistor, a source of the second field-effect transistor being coupled to the first switch terminal and a drain of the second field-effect transistor being coupled to the second switch terminal;
    a third capacitance to store electric charge;
    a fourth switch circuit that couples the first capacitance and the third capacitance in parallel; and
    a fifth switch circuit that couples the third capacitance between a gate and the source of the second field-effect transistor.

3. The analog switch circuit according to claim 1, further comprising:
    a detection circuit that detects a voltage between the gate and the source of the first field-effect transistor and controls the first switch circuit and the second switch circuit based on the detected voltage between the gate and the source of the first field-effect transistor.

4. The analog switch circuit according to claim 1, further comprising:
    a second field-effect transistor, a source of the second field-effect transistor being coupled to a third switch terminal, and a drain of the second field-effect transistor being coupled to a fourth switch terminal;
    a third capacitance to store electric charge;
    a fourth switch circuit that couples the first capacitance and the third capacitance in parallel; and
    a fifth switch circuit that couples the third capacitance between a gate and the source of the second field-effect transistor.

5. The analog switch circuit according to claim 1, further comprising:
    a variable direct current power supply that is coupled between the direct current voltage node and the reference potential node and supplies a variable direct current voltage.

6. The analog switch circuit according to claim 1, further comprising:
    a back gate switch circuit that couples a back gate of the first field-effect transistor to one of the source and the reference potential node.

7. The analog switch circuit according to claim 1, further comprising:
    a third capacitance to store electric charge;
    a fourth switch circuit that couples the third capacitance between the direct current voltage node and the reference potential node; and
    a fifth switch circuit that couples the second capacitance and the third capacitance in parallel.

* * * * *